United States Patent [19]

Scheve et al.

[11] Patent Number: 4,717,643

[45] Date of Patent: Jan. 5, 1988

[54] NO THERMAL CURE DRY FILM SOLDER MASK

[75] Inventors: Bernard J. Scheve; Clement L. Brungardt, both of Wilmington, Del.

[73] Assignee: Hercules Incorporated, Wilmington, Del.

[21] Appl. No.: 762,906

[22] Filed: Aug. 6, 1985

[51] Int. Cl.$^4$ .................. G03C 1/71; C08F 265/02
[52] U.S. Cl. .................. 430/284; 430/287; 430/18; 430/910; 522/96; 525/293
[58] Field of Search .......... 430/284, 287, 910, 18; 522/96; 525/293

[56] References Cited

U.S. PATENT DOCUMENTS

| | | | |
|---|---|---|---|
| 2,760,863 | 8/1956 | Plambeck, Jr. | 430/281 X |
| 3,694,415 | 9/1972 | Honda et al. | 525/293 X |
| 3,984,244 | 10/1976 | Collier et al. | 430/315 |
| 4,006,270 | 2/1977 | Morgan | 525/293 |
| 4,233,425 | 11/1980 | Tefertiller et al. | 522/96 X |
| 4,333,963 | 6/1982 | Emmons et al. | 522/96 X |
| 4,515,887 | 5/1985 | Davis | 430/287 X |

FOREIGN PATENT DOCUMENTS 0230020 12/1984 Japan .................. 525/293

*Primary Examiner*—Paul R. Michl
*Assistant Examiner*—Cynthia Hamilton
*Attorney, Agent, or Firm*—Marion C. Staves; William E. Player; John P. Luther

[57] ABSTRACT

Disclosed are dry film solder mask compositions containing a binder material that is the reaction product of: (a) a polymerized mixture of polypropyleneglycol monomethacrylate, methacrylic acid and, preferably, specific acrylates and methacrylates; and (b) isocyanatoethyl methacrylate. The masks are equal or superior to current dry film masks in affording protection to circuit boards.

6 Claims, No Drawings

NO THERMAL CURE DRY FILM SOLDER MASK

BACKGROUND OF THE INVENTION

This invention relates to solder masks used in the manufacture of printed circuit boards. More particularly, it relates to dry film solder mask compositions curable by exposure to U.V. radiation.

Dry film solder masks provide protection to the delicate circuitry on printed circuit boards during processing steps, such as etching and soldering, as well as providing continued protection from environmental stresses throughout the life of the circuit board. These masks must be resistant to solder compositions, as well as etching fluids such as methylene chloride, and also withstand environmental stresses such as changes in temperature and humidity, while remaining flexible enough to withstand mechanical stresses without cracking or peeling.

A dry film solder mask composition is, generally, applied to a circuit board, partially cured in the desired areas by exposure imagewise (through a phototool or negative) to ultraviolet radiation, and, after the unexposed composition is removed from the board, the partially cured mask is then fully cured by further exposure to U.V. radiation and heating. The art has taught that the final heating step, also called a thermal cure, is necessary to completely cure the mask so as to adequately protect the circuit board.

SUMMARY OF THE INVENTION

According to the invention, a dry film solder mask composition that is completely curable by exposure to ultraviolet radiation, with no thermal curing step required, is characterized in that the composition contains a novel binder material that is the reaction product of: (a) a polymerized mixture of polypropyleneglycol monomethacrylate, methacrylic acid and, preferably, specific acrylates and methacrylates; and (b) isocyanatoethyl methacrylate.

DETAILED DESCRIPTION OF THE INVENTION

The polymerized mixture can be described as a polymeric backbone to which molecules of isocyanatoethyl methacrylate (IEM) are grafted to form a novel binder material of this invention.

The polymeric backbone is made by reacting, in amounts based on the total weight of the backbone, about 5% to about 50% polypropyleneglycol monomethacrylate, about 5% to about 50% methacrylic acid, 0% to about 40% a $C_1$ to about $C_{12}$ alkyl acrylate or a mixture thereof, and 0% to about 40% a $C_4$ to about $C_{12}$ alkyl methacrylate or a mixture thereof. Typical alkyl acrylates and methacrylates usable in accordance with this invention are, for example, methyl acrylate, ethyl acrylate, isopropyl acrylate, butyl acrylate, lauryl acrylate, lauryl methacrylate, butyl methacrylate, etc. Optionally, hydroxypropyl methacrylate can be used in an amount equal to about 5% to about 20%, based on the weight of the backbone. The backbone components are polymerized to form the polymeric backbone by free radical initiated polymerization techniques which will be apparent to those skilled in the art, such as for example, solution or suspension, polymerization.

After the backbone is made, it is reacted with isocyanatoethyl methacrylate. In this way, the polymeric backbone is "end-capped" (i.e., molecules of isocyanatoethyl methacrylate are grafted to the backbone), and the novel binder materials formed. The amount of isocyanatoethyl methacrylate used is a molar amount equal to about 90% of the molar amount of the hydroxy substituted monomers (i.e., hydroxypropyl methacrylate and polypropyleneglycol monomethacrylate) used to make the backbone. The reaction with IEM can be carried out by heating the components in the presence of a stabilizer, such as for example, triphenyl phosphite or di-tert-butyl phenol, for one hour. Other suitable stabilizers, as well as other methods for grafting isocyanatoethyl methacrylate to the backbone, will be apparent to those skilled in the art.

A thus completed binder material is combined with photopolymerizable monomers and a photoinitiator to make, in accordance with this invention, a dry film solder mask composition that is fully curable by exposure to U.V. radiation. Suitable photopolymerizable monomers are acrylates or methacrylates, containing at least one terminal ethylenic group, that have a boiling point above 100° C. at normal atmospheric pressure, and that are capable of forming a high polymer by free-radical, photoinitiated, chain propagating addition polymerization, and have a plasticising effect on the binder. Typical examples of these acrylate and methacrylate monomers are found in U.S. Pat. Nos. 3,060,023 and 2,760,863, incorporated herein by reference. Typical examples of the photoinitiators useful in accordance with this invention are disclosed in U.S. Pat. Nos. 4,239,849 and 3,804,631, also incorporated herein by reference. Preferably, pigments and stabilizers as disclosed in U.S. Pat. No. 3,953,309, incorporated by reference herein, are also included in the solder mask. Optionally, other compounds, such as for example, adhesion promoters and leveling agents, well known to those skilled in the art, can also be included.

The solder mask compositions of this invention are constructed from their various components by methods that will be apparent to those skilled in the art. Typically, the components are stirred in a solvent at room temperature for about 30 minutes.

Thus solder mask compositions can be conveniently sold sandwiched between a flexible support film and a cover sheet as described in U.S. Pat. No. 4,293,635, incorporated by reference herein.

The circuit boards to which the solder mask compositions are to be applied in conjunction with this invention are made of suitable dielectrics that are well known to those skilled in the art, such as for example, an epoxy laminate fiberglass composition. A circuit, usually copper, but often including other metals, such as for example, aluminum, nickel, tin, lead, or gold, is present on the dielectric board. Processing steps such as soldering are conducted efficiently when only those portions of the circuit desired to be soldered are exposed. Then, the entire board can be emersed in a solder bath, with the solder only adhering to the exposed areas.

Since a solder mask is a permanent part of a circuit board, the board surface is preferably cleaned before applying the mask composition. Cleaning procedures vary depending on the metal in the circuit and are well known to those skilled in the art. For example, surfaces of tin/lead, tin, and gold are cleaned with a detergent, while more durable surfaces such as nickel or copper are scrubbed with abrasive brushes. Cleaning insures that no foreign material that could interfere with optimal electric performance is present between the mask and the circuit.

The solder mask compositions of this invention are coated onto circuit boards, cured, and developed so that desired areas of the board are protected by a solder mask, i.e., the cured composition.

The compositions are coated onto circuit boards in accordance with this invention by known methods that will be apparent to those skilled in the art. Preferably, a composition, supported on a U.V. radiation transmitting film, is vacuum laminated to a circuit board, with the board surface and the composition in contact. Vacuum lamination insures optimum conformation of the composition to the circuit tracings on the board.

Curing the solder mask compositions is done by exposure to U.V. radiation, preferably in two exposure steps, the steps being separated by a washing (developing) step. In the first step, a composition coated onto a circuit board as described above, is exposed imagewise (i.e., through a phototool) to U.V. radiation having an intensity of about 2 mW/cm$^2$ to about 20 mW/cm$^2$, preferably from about 3 mW/cm$^2$ to about 5 mW/cm$^2$, for a duration of about 30 seconds to about 5 minutes. The first step results in a latent image of partially cured mask in the exposed areas. The board is then washed (developed) in a suitable aqueous developing solution, which will be apparent to those skilled in the art, such as for example, sodium carbonate, 0.75% or sodium tripolyphosphate, 0.75%. Washing removes the unexposed solder mask composition from the circuit board. After developing, the partially cured mask is fully cured by exposure to U.V. radiation having an intensity of at least about 100 m W/cm$^2$ for a duration of at least about 30 seconds.

The no thermal cure solder masks made in accordance with this invention provide circuit board protection that is equal or superior to current dry film solder masks, while providing time and cost saving advantages by eliminating the thermal cure step needed in current dry film solder mask applications.

The following examples are included to more fully explain the instant invention. However, this invention is not limited to these examples. All parts and percentages are by weight unless indicated otherwise.

Example 1

A backbone polymer is prepared from a mixture of acrylate monomers, as listed below.
   80 parts of polypropyleneglycol monomethacrylate having a weight average molecular weight of 369
   80 parts of methacrylic acid
   140 parts of methyl methacrylate
   100 parts of ethyl acrylate
   2.1 parts of n-dodecyl mercaptan Eighty parts of this mixture is loaded into a reactor along with 280 parts of MEK (methyl ethyl ketone). The remaining 320 parts of the mixture is loaded into a dropping funnel attached to the reactor. The entire apparatus is flushed with a constant stream of N$_2$ (100 ml/min.) for 45 minutes then heated to 75° C. The reactor is heated at 75° C. under a nitrogen atmosphere, for the next 8 hours. During that time, the remaining 320 parts of the mixture and a thermal-free radical initiator, AIBN (azo-bisisobutyronitrile), are added according to the time table listed below.

| TIME | AIBN Soln* | MIXTURE |
| --- | --- | --- |
| 0–80 min. | 7.9 ml | 40 parts/hour |
| 80–160 min. | 3.9 ml | 40 parts/hour |
| 160–240 min. | 3.9 ml | 40 parts/hour |
| 240–320 min. | 2.9 ml | 40 parts/hour |
| 320–400 min. | 2.9 ml | 40 parts/hour |
| 400–480 min. | 3.9 ml | 40 parts/hour |

*The AIBN solution contains 1.0 part of AIBN per 8 parts MEK.

The reaction mixture is then heated at 75° C. for 15 hours to complete the polymerization of the monomers and to completely decompose the free radical initiator. This binder has a viscosity of 13,000 at 50° C. in MEK.

After the polymerization of the binder is complete, the reactor is opened to the air and stirred vigorously for one hour. While the reaction mixture is stirring, 1.5 parts of butylated hydroxy toluene, and 1.5 parts of triphenyl phosphite in 20 ml of MEK are added. The reaction mixture cools to 35°–40° C. during this time. Then, 33.5 parts isocyanatoethyl methacrylate (IEM) is added dropwise over a period of 20 minutes. After the addition of IEM is complete, the reaction mixture is heated at 45° C. for one hour. Foaming (30–40% of the original volume) occurred during the addition of IEM and during the heating of the reaction mixture. Finally, about 10 parts of HPMA (2-hydroxylpropyl methacrylate) are added to remove residual isocyanate, and the solution is cooled to room temperature. An infrared (I.R.) spectrum is taken to check for residual isocyanate. Residual isocynate is found to be present and removed.

To make a solder mask composition of this invention, 80 parts of this binder (50% solids) are added to 11.2 parts of pentaerythritol tetraacrylate, 3 parts of dimethoxyphenyl acetophenone (a photoinitiator) and 0.25 parts Monastral green GN dye.

To make a solder mask, this composition is coated onto 1 mil polyester film to a thickness of 4 mil and allowed to air dry. It is then vacuum laminated at 140° F. onto a printed circuit board. The board is imaged by exposure to U.V. radiation at about 3.3 mW/cm$^2$ for about 2 minutes through a negative, the film removed, and the unexposed areas washed out in 0.75% sodium carbonate. The board is again exposed to U.V. radiation for about 30 seconds. The finished board is immersed in methylene chloride, and the areas protected by the mask do not show any etching even after ½ hour. The coating also passes the IPC 840 moisture and insulation test, hydrolytic test and electromigration test.

EXAMPLE 2

To 2800 parts of distilled water is added 0.96 parts potassium persulfate, 0.60 parts of sodium lauryl sulfate, and 2.409 parts of a polyether anionic surfactant, namely a sodium salt of an alkylaryl polyether sulfonate. This mixture is heated to 60° C. while a solution of 32 parts of polypropyleneglycol monomethacrylate having a weight average molecular weight of 369, 136 parts ethyl acrylate, 3.2 parts of lauryl methacrylate, and 100 parts of butyl methacrylate are added dropwise over a three hour period.

This solution is stirred 1 hour at 60° C., cooled, poured into 5% sodium chloride solution and filtered. The white solid is air dried for 3 days. To 103 parts of solids is added 1300 parts of acetone and 11 parts of IEM. This is stirred for 3 days and IR analysis showed no residual isocyanate.

To 90% of the above binder material is added 3.9 parts pentaerythritol tetraacrylate, 3.9 parts of trimethylolpropane triacrylate, 1.5 parts of dimethylbenzylketal photoinitiator, and 0.2 parts Monastral green dye.

This mixture is coated on a printed circuit board, dried, and exposed as in Example 1. The sample is developed in 0.75 parts sodium carbonate solution. The coating is partially exposed for 30 seconds to U.V. radiation. A very elastic coating is obtained.

EXAMPLE 3

A binder is prepared as in Example 1 using 10 parts hydroxypropyl methacrylate (HPMA), 20 parts polypropyleneglycol monomethacrylate (PPM), 20 parts lauryl methacrylate, 20 parts methacrylic acid, 30 parts methyl methacrylate and parts IEM.

A solder mask composition is made as in Example 1 using parts binder, 13 parts photopolymerizable monomers, i.e., 6.5 parts trimethylopropane trimethacrylate and 6.5 parts trimethylopropane trimethacrylate propoxylate, 3 parts dimethoxyphenyl acetophenone as a photoinitiator, and 0.5 parts Penncolor PCN green dye as a pigment.

The solder mask composition is used to make a solder mask on a circuit board as in Example 1.

EXAMPLES 4 and 5

Solder mask compositions are prepared, from which solder masks are made on circuit boards, as in Example 1. The following solder mask composition formulas are used.

| Example 4 | Example 5 |
|---|---|
| Binder | |
| 10 parts HPMA | 40 parts PPM having a weight average molecular weight of 369 |
| 30 parts PPM having a weight average molecular weight of 369 | |
| | 10 parts laurylmethacrylate |
| 20 parts methacrylic acid | 20 parts methacrylic acid |
| 40 parts methyl methacrylate | 30 parts methyl methacrylate |
| 22 parts IEM | 16.5 parts IEM. |
| Solder Mask Composition | |
| 80 parts binder | 80 parts binder |
| 5 parts trimethoxypropane trimethacrylate | 3 parts trimethoxypropane trimethacrylate |
| 5 parts trimethoxypropane trimethacrylate propoxylate | 3 parts trimethoxypropane trimethacrylate propoxylate |
| 3 parts dimethoxyphenyl acetophenone | 3 parts dimethoxyphenyl acetophenone |
| .5 parts Penncolor PCN green dye | .5 parts Penncolor PCN green dye |

We claim:

1. A binder material comprising the reaction product of:
   (a) a polymerized mixture comprising, in percentage amounts based on the weight of the mixture, about 5% to about 50% polypropyleneglycol monomethacrylate, about 5% to about 50% methacrylic acid, 0% to about 40% a $C_1$ to about $C_{12}$ alkyl acrylate or a mixture thereof, and 0% to about 40% a $C_4$ to about $C_{12}$ alkyl methacrylate or a mixture thereof; and
   (b) isocyanatoethyl methacrylate.

2. The binder material of claim 1 wherein the alkyl acrylate is ethyl acrylate.

3. The binder material of claim 1 wherein the alkyl methacrylate is lauryl methacrylate.

4. In a dry film solder mask composition comprising a binder material, photopolymerizable monomers, and a photoinitiator, the improvement wherein the binder material comprises the reaction product of: (a) a polymerized mixture comprising, in percentage amounts based on the weight of the mixture, about 5% to about 50% polypropyleneglycol monomethacrylate, about 5% to about 50% methacrylic acid, 0% to about 40% a $C_1$ to about $C_{12}$ alkyl acrylate or a mixture thereof, and 0% to about 40% a $C_4$ to about $C_{12}$ alkyl methacrylate or a mixture thereof; and (b) isocyanatoethyl methacrylate.

5. In a printed circuit board coated with a solder mask composition comprising photopolymerizable monomers, a photoinitiator, and a binder material, the improvement wherein the binder material comprises the reaction product of: (a) a polymerized mixture comprising, in percentage amounts based on the weight of the mixture, about 5% to about 50% methacrylic acid, 0% to about 40% a $C_1$ to about $C_{12}$ alkyl acrylate or a mixture thereof, and 0% to about 40% a $C_4$ to about $C_{12}$ alkyl methacrylate or a mixture thereof; and (b) isocyanatoethyl methacrylate.

6. In a circuit board having attached thereto a dry film solder mask composition comprising photopolymerizable monomers, a photoinitiator, and a binder material, wherein said composition has been cured by exposure to sufficient U.V. radiation, the improvement wherein the binder material comprises the reaction product of: (a) a polymerized mixture comprising, in percentage amounts based on the weight of the mixture, about 5% to about 50% methacrylic acid, 0% to about 40% to $C_1$ to about $C_{12}$ alkyl acrylate or a mixture thereof, and 0% to about 40% a $C_4$ to about $C_{12}$ alkyl methacrylate or a mixture thereof; and (b) isocyanatoethyl methacrylate.

* * * * *

UNITED STATES PATENT AND TRADEMARK OFFICE
CERTIFICATE OF CORRECTION

PATENT NO. : 4,717,643
DATED : January 5, 1988
INVENTOR(S) : Brungardt & Scheve

It is certified that error appears in the above-identified patent and that said Letters Patent is hereby corrected as shown below:

Column 5, line 16 " and parts "

should read -- and 18 parts --

Column 5, line 18 " Example 1 using parts "

should read -- Example 1 using 80 parts --

Column 6, Claim 5, line 34 " 5% to about 50% methacrylic "

should read -- 5% to about 50% polypropyleneglycol monomethacrylate, about 5% to about 50% methacrylic --.

Column 6, Claim 6, line 47 " 5% to about 50% methacrylic "

should read -- 5% to about 50% polypropyleneglycol monomethacrylate, about 5% to about 50% methacrylic --.

Signed and Sealed this

Seventh Day of June, 1988

*Attest:*

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO. : 4,717,643
DATED : January 5, 1988
INVENTOR(S) : Brungardt & Scheve

It is certified that error appears in the above-identified patent and that said Letters Patent is hereby corrected as shown below:

Column 5, line 14 " polypropylenegylcol "

should read   -- polypropyleneglycol --

Signed and Sealed this

Second Day of August, 1988

Attest:

DONALD J. QUIGG

Attesting Officer

Commissioner of Patents and Trademarks